United States Patent [19]
Seifert

[11] 4,365,666

[45] * Dec. 28, 1982

[54] HEAT EXCHANGER

[76] Inventor: Rolf Seifert, Laakbaum 16, 5608 Radevormwald, Fed. Rep. of Germany

[*] Notice: The portion of the term of this patent subsequent to Jan. 15, 1997, has been disclaimed.

[21] Appl. No.: 81,119

[22] Filed: Oct. 2, 1979

Related U.S. Application Data

[63] Continuation-in-part of Ser. No. 789,834, Apr. 22, 1977, Pat. No. 4,183,400.

[30] Foreign Application Priority Data

May 12, 1979 [DE] Fed. Rep. of Germany ....... 2919267

[51] Int. Cl.³ .............................................. F28D 15/00
[52] U.S. Cl. ................................. 165/104.29; 165/47; 165/104.33; 417/108
[58] Field of Search ................... 165/106, 107, 104.33, 165/104.19, 104.29, 47; 361/382–385; 417/108

[56] References Cited

U.S. PATENT DOCUMENTS

| 1,030,091 | 6/1912 | Johnson | 165/107 X |
| 1,935,053 | 11/1933 | Jaeger | 165/107 X |
| 2,187,011 | 1/1940 | Braden | 361/384 X |
| 3,220,471 | 11/1965 | Coe | 165/80 X |
| 3,299,946 | 1/1967 | Recklinghausen | 165/80 |
| 3,807,493 | 4/1974 | Stewart | 165/104.33 X |
| 4,183,400 | 1/1980 | Seifert | 165/107 R |

FOREIGN PATENT DOCUMENTS

| 857384 | 11/1952 | Fed. Rep. of Germany | 165/107 |
| 1840948 | 11/1961 | Fed. Rep. of Germany | 361/384 |
| 2138376 | 2/1973 | Fed. Rep. of Germany | 361/384 |

*Primary Examiner*—Albert W. Davis
*Attorney, Agent, or Firm*—Holman & Stern

[57] ABSTRACT

A heat exchanger including a heat-dissipating element, a heat-receiving element and a circulating means for circulating a liquid in a closed cycle between the heat-dissipating element and the heat-receiving element. The circulating means includes an air/liquid siphon consisting of one of the elements, an air moving pump and an air supply means connecting the siphon to the pump. The heat-receiving element is located in a sealed air-exchange relationship with a cabinet.

7 Claims, 10 Drawing Figures

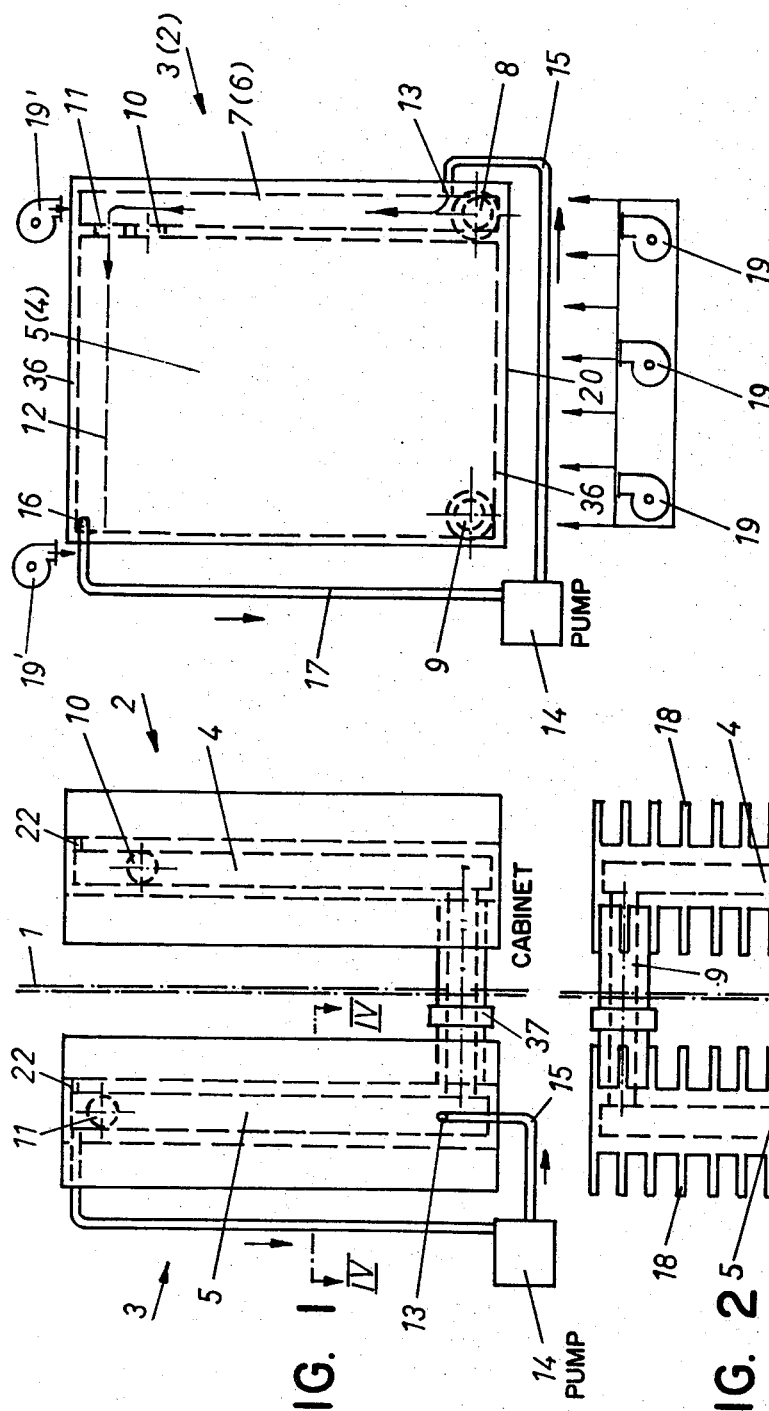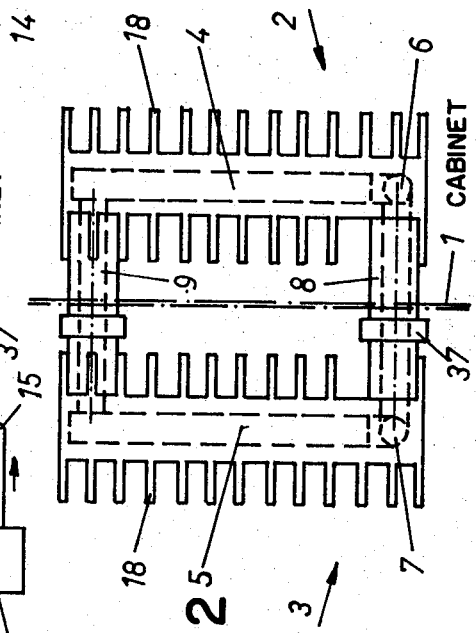

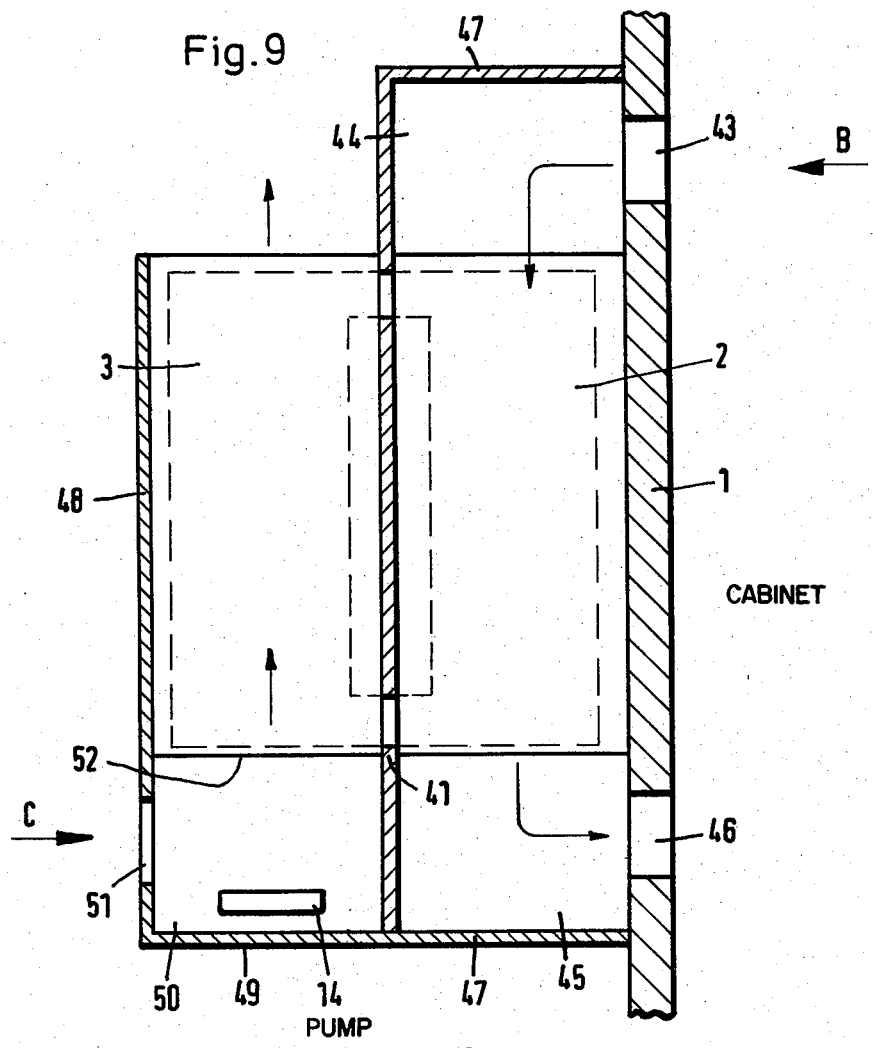
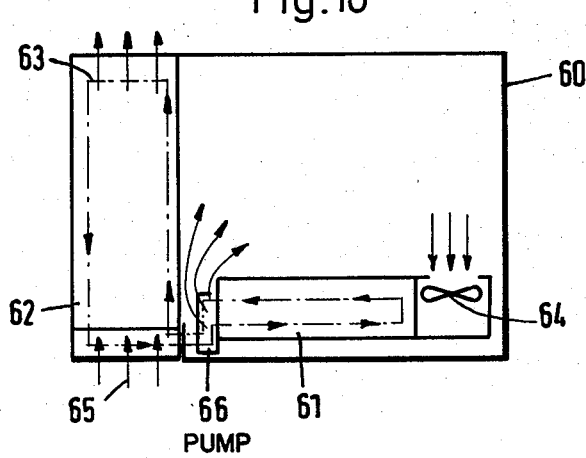

HEAT EXCHANGER

This application is a continuation-in-part of U.S. Ser. No. 789,834, filed Apr. 22, 1977, now U.S. Pat. No. 4,183,400.

BACKGROUND OF THE INVENTION

The present invention concerns a heat exchanger for removing heat from cabinets which are utilized for the reception of electronic and/or electrical structural elements, especially such cabinets which are dust-tight and airtight. The heat exchanger includes a heat-receiving element adapted to be positioned in a sealed air-exchange relationship with the cabinet and a heat-dissipating element adapted to be positioned outside the cabinet, and both elements in combination form a closed cycle in which a liquid circulates, whereby a pump is proposed for the liquid circulation.

Heat exchangers are known in the prior art, having varying structures and various areas of utilization. The instant invention concerns the problem of heat removal from cabinets, in which are located electrical and/or electronic structural elements, such as, for example, transistors or thyristors. In a comparatively small space, such types of structural elements generate a relatively large amount of heat which must be dissipated outwards via a comparatively small cabinet space. Also in many instances the inside of the cabinet must be sealed airtight or dust-tight since the sensitive electronic or electrical structural elements must be protected from the influence of the atmosphere, especially from dust. Since, thereby in most cases cooling by means of atmospheric air blown into the cabinet and exiting from the cabinet at a certain point is prohibited, the door of such cabinets is usually provided with ventilating cooling ribs at its inside and its outside. Even through this produces an air-cooling in which the entry of outside air into the inside of the cabinet is prevented, the heat transport obtained with such a door, however, is too small for a great many cases of utilization. The heat must be received at the door and cannot definitively be accepted in the cabinet at a point where it would be most advantageous. Additionally, the ventilators develop a relatively loud noise, which, especially in the otherwise very quiet electrical or electronic installations, is considered undesirable.

There are also known water-cooled thyristors which are screwed with a threaded portion into a block through which flows cooling water. The block and the thyristors are located in a cabinet. The heat moves from the thyristors via the block to the water. The water is guided by means of a mechanical pump to a cooler located outside the cabinet, for example, by means of a piston pump or a centrifugal pump, which is located in the water cycle. The water is then cooled and again returned to the block inside the cabinet. This system, in many regards, is disadvantageous. Sucy types of pumps and their component hose connections generally begin to leak after a certain period of time. In spite of constant maintenance of the pump, there exists the danger that cooling liquid will leak out during the interval between inspections. A loss of cooling liquid may result in the heat transport being either insufficient or nonexistent, which results in an overheating of the electrical or electronic structural elements. Leaking liquid, when there is a combination of unfavorable circumstances in the electrical installations, can result in short circuits. The hose systems, which are component parts of the liquid pump, become weak. In cases where maintenance work on the pump and/or the hose systems requires the opening of the cabinet which houses the electronic structural elements, there exists the above-mentioned danger of dust entering the cabinet. Mechanical pumps and their motor gears are expensive and develop relatively loud noises. The life span of storage of the motor gears is comparatively too short.

SUMMARY OF THE INVENTION

It is an object of the present invention to provide a heat exchanger for the purpose of removing heat from cabinets which house electronic and/or electrical structural elements, in which the above-mentioned disadvantages of the known heat exchangers are eliminated, where the heat transition is made by air only.

It is another object of the instant invention to provide a heat exchanger which is able to remove substantially more heat than formerly possible from a comparatively small space, for example, from the inside of a 19-inch cabinet, whereby the disadvantages of liquid leakage, relatively high wear and maintenance of instruments, and excessive noise inherent in prior art pumps are also eliminated.

Furthermore, the instant invention proposes a structural shape of the heat-receiving and heat-dissipating elements in such a manner that these elements may be substantially similar and manufactured from the same extrusion profile. The elements should further be able to be manufactured in a compact, space-saving structure as an assembly unit.

The instant invention proposes that the liquid is not immediately moved by means of mechanical parts, but that one of the elements is structured as an air-liquid siphon which comprises the components which guide the liquid and an air-input means. The inventive heat exchanger also includes an airlift pump. One type of air/liquid siphon is known commercially as a "Mammut Pump". It has surprisingly been found that an intensified cycle which receives the heat of a liquid transported from one element to the other element is obtained, which is comparable with the liquid circulation by means of a centrifugal pump or a piston pump. Between the heat-dissipating and the heat-receiving elements may be provided solid pipes and their connecting means. The inventive arrangement functions practically noiselessly, since the airlift pump does not require a noise-producing drive system, but may be constructed, for example, as a membrane activated by a magnet.

In case one intends to increase the heat reception and heat dissipation of the elements still further by air-cooling ribs, and their component ventilating means, the ventilating means may be constructed so small in size that they produce only very little noise.

The heat-receiving and heat-dissipating elements may be constructed comparatively small and compact so that a number of such elements may be provided also in a smaller cabinet, for example on the outside and the inside of the cabinet door, whereby the inlets and outlets of the liquid are guided through the cabinet door. It is thus possible to remove a relatively large amount of heat from a comparatively small cabinet, whereby the inside of the cabinet can remain sealed airtight and dust-tight against the atmosphere. The heat-receiving element may be arranged in the cabinet at precisely that point at which it should be positioned for constructural and heat-technical reasons.

It is a further advantage of the instant invention that one of the elements performs to a large extent, the function of an air/liquid siphon. The only element remaining to be provided is the above-mentioned small airlift pump, for example, a membrane pump, which is to be connected by means of air-guiding pipes with the respective element. Liquid pumps and their component hose systems, sealers, or the like, are not required.

In addition to the aforementioned advantages, there result furthermore the advantages of correspondingly lower manufacturing costs. This advantage will become even more obvious in connection with an inventive construction of the elements, which is explained in greater detail hereinbelow, wherein the elements are formed of sections of an extrusion profile. To this is added the advantage that the sections have a long life span and are maintenance-free, and also the membrane pump has no parts which could wear out. Also, existing cabinets may consequently be provided with the instant inventive system.

It is the preferred embodiment of the instant invention that at least the outer heat-dissipating element is provided with an uptake pipe and a hollow space; that the inflow pipe of the warm liquid from the heat-receiving element will terminate in the lower area of the uptake pipe; that an overflow from the upper area of the uptake pipe is provided into the hollow space; and that a pipe for supplying the cooled liquid to the heat-receiving element leads away from the lower area of the hollow space. However, the air supply inlet of the airlift pump may terminate above the supply pipe for the warm liquid into the uptake pipe. Thus liquid transport with the air of the uptake pipe is provided, while the hollow space and the walls surrounding it serve for accepting the dissipated heat.

The inventive arrangement may comprise a compact, space-saving and prefabricated structural unit consisting of the element functioning as the air/liquid siphon, possibly the membrane pump or the like, for moving air, and possibly ventilators for additional air-cooling. This structural unit, with its inlet and outlet pipes is connectable with the corresponding inlet and outlet pipes of the other element, or the other structural unit. According to the instant invention, automatically-closing plug junctions may be provided as connections. This has the substantial advantage that the elements can be filled with the liquid at the factory and can be shipped already assembled for installation in this condition to their point of utilization, where the elements only need to be mounted and fastened inside or outside the cabinet. Furthermore, the inlet and outlet pipes of the elements have to be coupled together, whereby, advantageously, no liquid will get lost. In this connection, the utilization of a "Mammut Pump" with a closed air circulation is of especial advantage since also herein no liquid will be lost. Thus, there exists a closed liquid circulation in which practically no liquid will have to be supplemented so that also in this respect there is no need for maintenance. The instant invention permits rigid pipes being provided from the elements to the plug junctions. In so far as there are required flexible hoses, such may also be used. In both cases, the advantages of an assembled, plug-in type unit described herein are noticeable.

The instant invention further proposes that at least the heat-dissipating element is formed from an extrusion profile, in which the outer cooling ribs as well as the inner areas which contain the liquid, and the uptake pipe and the hollow space which is heating or cooling the liquid are all provided in the longitudinal direction of the element; whereby the upper and the lower frontal areas of the extrusion profile, or at least the outlet openings of the areas, are tightly sealed, for example by means of a plate which is soldered or welded thereon. This produces a substantial reduction in the manufacturing costs of the heat-exchanging elements, since the outer air-cooling ribs and the inner areas guiding the liquid can be simultaneously produced with a single tool. The inventive design of these elements is preferably made in such a manner that only a small amount of materials between the hollow space and the cooling ribs is required, however, the cooling ribs in contrast could be formed as long as possible. As a result of this, the reduction in quantity of material and therewith a reduction of material costs and weight produces an increase in the heat dissipation or heat reception. Such type of element is for once utilizable in a special advantageous manner in connection with the main scope of the instant invention, and furthermore with the remaining characteristics of the instant invention. An element of such design may be utilized also in other connections, such as for example, in other systems of liquid circulation.

In the manufacture of the elements from an extrusion profile, it is possible to extrude elements of various lengths and therewith of various heat dissipation and heat reception. Disregarding the sealing of the frontal side, soldering- and welding-work is not required. The only work remaining is the attaching of the inlet and outlet pipes, and the boring of a hole for the outflow or overflow.

The instant invention may preferably be realized by forming the heat-receiving element identical to the heat-dissipating element. The manufacturer for this purpose has to produce only one single structural part, which he can utilize, after attaching the respective inlet and outlet pipes, either as a heat-receiving or heat-dissipating element. This fact results in a substantial reduction of the manufacturing costs. Additionally, there is a further possible reduction of the manufacturing cost if one produces the identical heat-receiving and heat-dissipating elements, as above explained, from sections of the same extrusion profile.

In a further embodiment of the instant invention the heat-receiving element can be in immediate connection with the electronic or electrical structural parts to be cooled. Such an element may be a transistor-bench through which the liquid flows, a liquid-cooler for semiconductors, and the like. Thus, the liquid circulation of the heat-receiving element is connected with the liquid circulation of the heat-dissipating element into a closed cycle. The area of utilization of the instant invention is thereby substantially increased, as a result of an immediate heat dissipation from the structural elements to be cooled.

BRIEF DESCRIPTION OF THE DRAWINGS

Additional advantages and characteristics of the instant invention will be described with reference to the accompanying drawings in which:

FIG. 1 is a schematic front view of a heat exchanger according to the instant invention;

FIG. 2 is a schematic top view of the heat exchanger shown in FIG. 1;

FIG. 3 is a schematic side view of the heat exchanger shown in FIG. 1;

FIG. 9 shows a side view according to the arrow A in FIG. 8, in partial cross-section; and FIG. 10 represents a further embodiment in a lateral view.

DETAILED DESCRIPTION OF PREFERRED EMBODIMENTS

Figure 4:
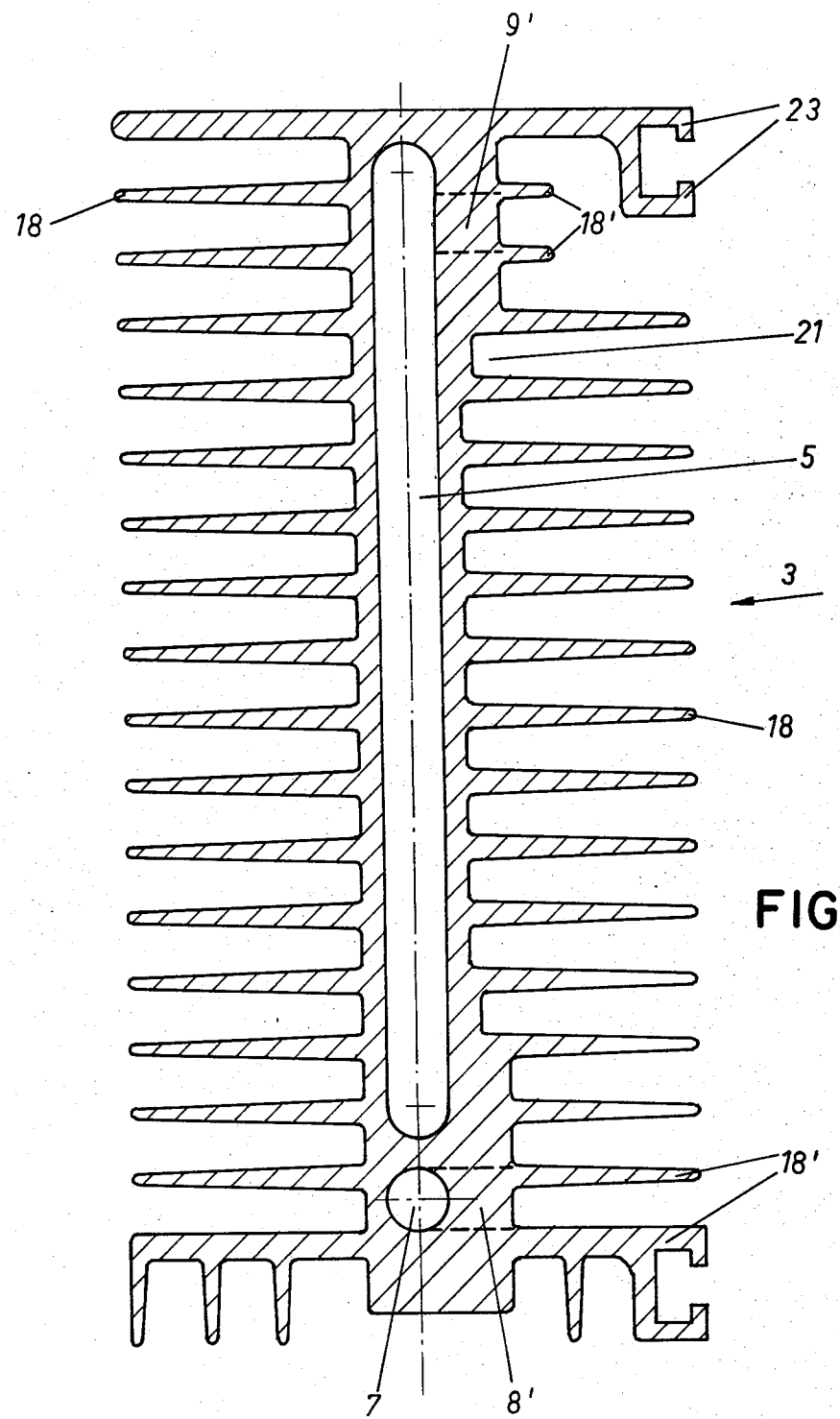
FIG. 4 is an enlarged cross-sectional view taken along line IV—IV of FIG. 1.

FIGS. 1 to 3 show schematically the arrangement of the heat exchanger according to the instant invention, while FIG. 4 represents more in detail the structural form of a preferred embodiment of such a heat exchanger. Numeral 1 depicts by a broken line the door of a cabinet (not shown) for accepting electronic structural elements. Inside the cabinet is located a heat-receiving element 2, with a heat-dissipating element 3 being located outside the cabinet. Both elements form together a closed cycle of a liquid which transports the heat. This liquid may either be water or, in case the elements are manufactured of aluminum, a liquid which is compatible with aluminum. In one preferred embodiment of the instant invention, the liquid circulation is as follows:

Each of the elements is provided at its interior with an elongated hollow space 4 or 5, as well as an uptake pipe 6 or 7, running parallel therewith. Both uptake pipes are connected in their lower area by means of a pipe 8, while the two hollow spaces 4 and 5 are connected in their lower area by means of a pipe 9. An outflow 10 from uptake pipe 6 to the hollow space 4 of the element 2 positioned inside the cabinet is lower than the overflow 11 from the uptake pipe 7 to the hollow space 5 of the element 3 positioned outside the cabinet. The liquid level 12, in accordance with the illustration in FIG. 3 is located in the hollow spaces 4, 5 above the overflows 10, 11.

A "Mammut Pump" is proposed for moving the liquid in this cycle. For this purpose, one of the elements 2 or 3, which, in the instant embodiment, is the heat-dissipating element 3, in the lower area of the uptake pipe above the entry of the inlet pipe 8, is provided with an air supply means such as an air spray nozzle 13, which supplies air by means of a small magnetically-operated membrane pump 14 via a pipe 15.

The manner of operation is as follows:

The air supplied into the uptake pipe 7 from the air supply means 13 forces the liquid head in the uptake pipe 7 upwards, and takes along the liquid on the basis of the principle of lift. The uptake pipe 7 and the air input means 13 of this element form a part of the "Mammut Pump", whereby the liquid in the intake pipe 7 represents the warm liquid dissipated by the element 2. The warm liquid reaches the hollow space 5 via the overflow 11 wherein it will be cooled. The cool liquid is guided from the hollow space 5 via the pipe 9 to the hollow space 4 of the element 2. In this element, the liquid absorbs heat and flows from the hollow space 4 via the outflow 10 into the uptake pipe 6 and from there via the pipe 8 back again into the uptake pipe 7 of the element 3, thus concluding the liquid circulation. The air which is moved upwards in the uptake pipe 7 and which is reaching the hollow space 5, is collected above the liquid level 12 and is guided back to the membrane pump 14 through an opening 16 and a return pipe 17. The liquid level 12 is located above the outflow 10. The overflow 11 may be located above the liquid level. An optimal arrangement is then provided, when the upper half portion of the overflow 11 is located above, and the lower half portion is located below the liquid level 12.

The energy requirement for operating the membrane pump is extremely low.

The outer surface area of the elements 2, 3 may be provided with air cooling ribs 18, running in the longitudinal direction of the elements. The heat acceptance and heat dissipation of the elements 2, 3 is thereby accordingly increased. In case the heat transport per unit time is to be increased still further, there may then be located force-ventilating elements either above or below the elements 2, 3, which are shown schematically in FIG. 3 by numerals 19, whereby the flow of air produced by these elements is schematically depicted by arrows. The air flow is thus accelerated upwards along the cooling ribs 18. Instead, the force-ventilating elements could also be located above the elements 2, 3, according to numerals 19'. A movement of the air by the elements 19' downward according to the arrows produces an especially intensive heat dissipation and heat acceptance, since the forced air will travel counter-current to the air which, on the basis of natural convection, rises from the bottom to the top. Tangential blowers serve preferably for moving the air since they move a large amount of air at a low pressure, and they produce very little noise. Tests have shown that it is possible to remove approximately 1500 Watts from a closed 19-inch cabinet per each pair of force-ventilating elements, whereby, on a two-meter high 19-inch cabinet, up to six of such unit pairs can be attached. In case there should be removed a lesser amount of heat from the cabinet, it is then possible to dispense with the forced-ventilation of one or of both elements 2, 3. The ventilating elements and possibly the membrane pump may be mounted at the bottom portion 20 of the respective element so that, together with the element, they form a structural unit assembly.

The elements 2, 3 can be formed in an especially advantageous inventive arrangement out of one extrusion profile having a cross-section as seen in FIG. 4. As explained, the hollow spaces 4, 5 and the uptake pipes 6, 7, i.e., the inner areas through which the liquid flows, and the outer form, especially the cooling ribs 18, can thus be produced by means of one tool. The upper and the lower frontal side are each tightly sealed at least in the area of the hollow spaces 4, 5 and the uptake pipes 6, 7, for example by means of a plate 36, which is soldered or welded onto the corresponding portion of the respective frontal area of the extrusion profile piece which has been cut off. In order not to interfere with the air circulation, these plates should possibly not extend into the spaces 21 between the cooling ribs 18.

The extrusion profiles consist preferably of aluminum. Aluminum can be worked relatively well into such profiles in the extrusion method and aluminum has a relatively high heat-conductivity.

In the upper area of each of the hollow spaces 4,5 and above the liquid level 12, there may be provided a thin borehole 22 which connects this space with the outside atmosphere. This will prevent an overpressure from developing in this space above the liquid level, which would counteract the liquid transport during the liquid movement by means of the "Mammut Pump". Should there develop for any reason some change in pressure, this may then be equalized through balancing of the outside air via this borehole 22.

From the above-mentioned explanation of the embodiment of FIGS. 1 to 3 it can be seen that the heat-accepting element 2 is practically identical in form with the heat-dissipating element 3 and preferably consists of the same extrusion profile. In accordance with this embodiment, there will only have to be attached, or provided, the pipes 8, 9, the outflows or overflows 10, 11, the air supply means 13 and the air-removing means 16. In the area of the respective connecting boreholes 8', 9', the existing cooling ribs 18' should be removed (see FIG. 4). Portions 23 serve for the attaching of fastening means for fastening the elements inside the cabinet or outside the cabinet.

It is recommended to provide the two elements 2, 3 at their connection pipes 8, 9 with automatically-closing plug connections 37, which will automatically open with the producing of the plug connection. The identical plug connections may also be provided in the hereinbelow described embodiments. Such automatically-closing plug connections 37 permit the possibility of filling the elements with the heat-transporting liquid at the place of manufacture. The user is thus not required to handle the liquid and to fill the elements with the liquid at the place of their utilization. During assembly and disassembly of the elements, there is no longer any liquid lost. As already mentioned above, on the basis of the utilization of the illustrated and described closed air cycle of the "Mammut Pump" there will be no liquid loss during operation. Also, transistor benches and the like, as explained below, may be provided at the ends of their inlet means and outlet means with automatically closing plug connections 37. Thus, also these transistor benches or the like can be shipped by the manufacturer while filled with the liquid. In case such types of transistor benches or the like are located at the place of assembly, they may be changed over consequently in accordance with the instant invention and liquid-sealingly connected with the heat-dissipating element. If more liquid is needed, it may be supplied into the thus closed liquid cycle through an inlet opening (not shown).

The heat accepting element 2, according to the embodiment of FIGS. 1 to 3, receives the heated air in the cabinet and leads it via the liquid to the heat-dissipating element 3.

Figure 5:
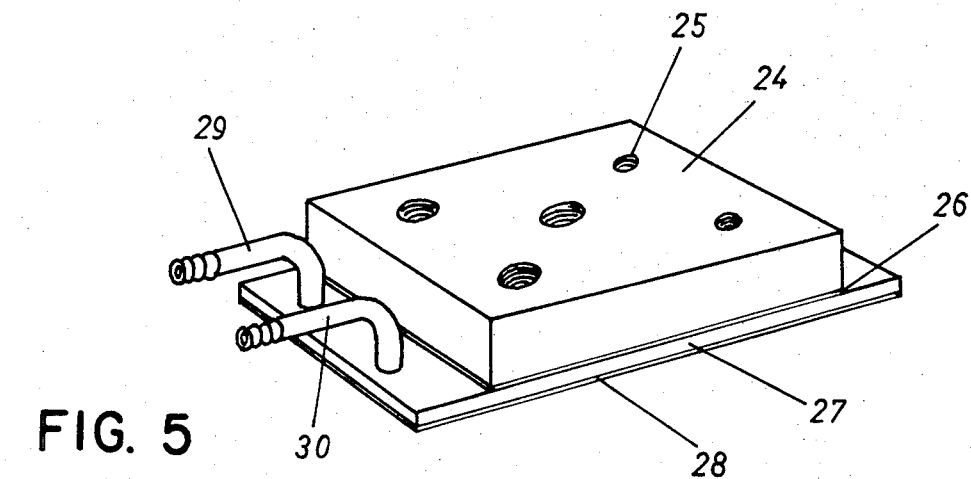
FIG. 5 is a perspective view of a water cooler for a semiconductor.
Figure 6:
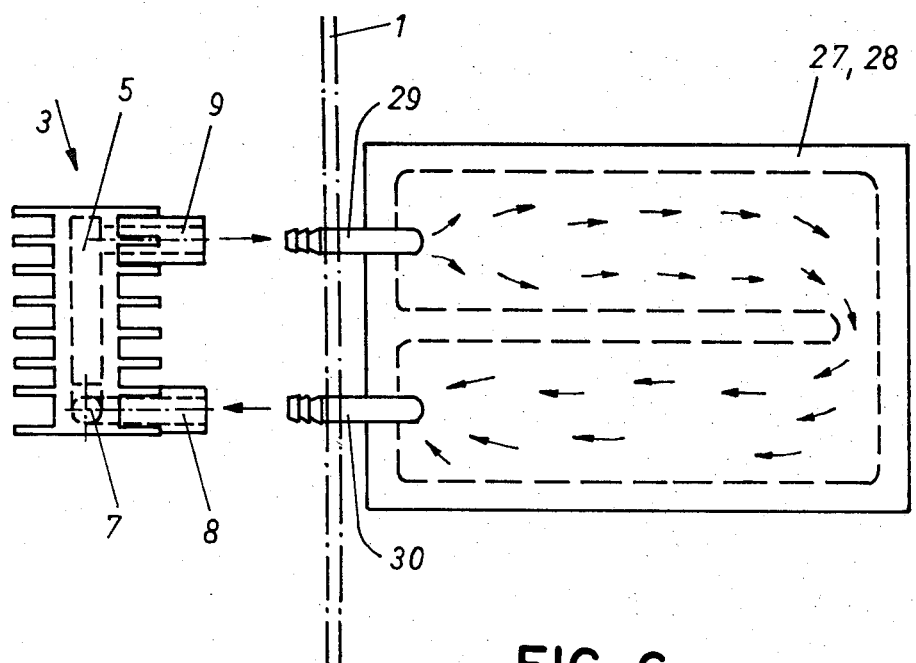
FIG. 6 is a schematic top view showing the connection of the water cooler of FIG. 5 with a heat-dissipating element.

The heat receiving element may however also be in an immediate heat-transmitting contact with the structural elements to be cooled, whereby the inlet and the outlet means of the liquid of the heat receiving element can be connected, or are connectable, with the respective inlets and outlets of the heat dissipating element. In this regard, FIGS. 5 and 6 show the embodiment of a watercooled semiconductor. In a cooling block 24 are located threaded boreholes 25 for receiving the semiconductor. Separated from an electrical insulating layer 26, there are located, immediately below the cooling block 24, a cooling plate 27 and a bowl 28, between which the cooling liquid flows, as shown in FIG. 6 by means of arrows. The inlet and outlet pipes of this liquid cycle are shown by numerals 29, 30. These pipes are connectable to connection means of a heat-dissipating element 3, depicted by numerals 8 and 9, and which can be accomplished by means of the explained automatically-closing plug connection.

Figure 7:
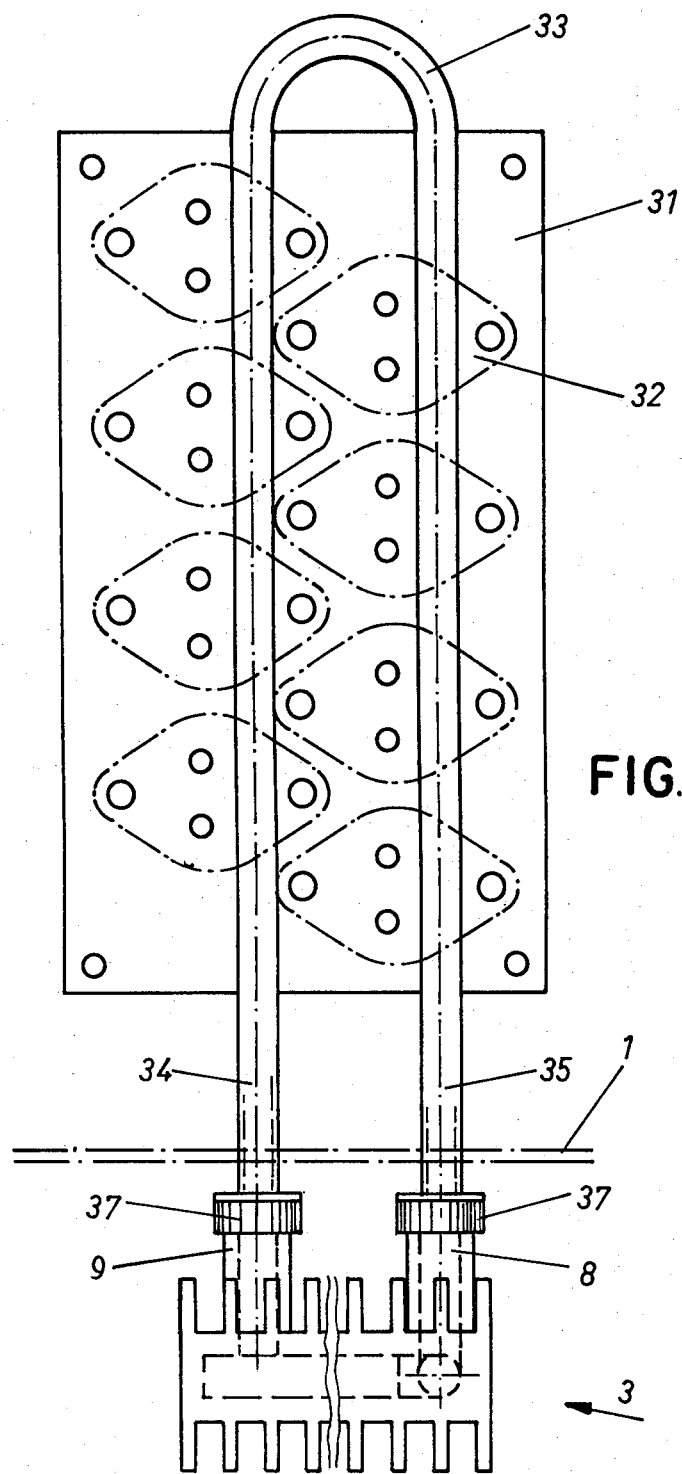
FIG. 7 is a schematic top view of a transistor bench connected with a heat-dissipating element.

FIG. 7 shows the embodiment of a transistor bench in which holder means 32 for transistors are mounted on a base plate 31. A pipe 33, through which liquid flows, receives the heat produced by the transistors and, with its inlet 34 and outlet 35, is connected to the corresponding pipes 9, 8 of the heat-dissipating element 3 by means of the plug connections 37.

In each of the embodiments according to FIGS. 5, 6 and 7, the liquid cycle of the heat-receiving element (semiconductor cooler or transistor bench) is integrated into the liquid cycle of the heat-dissipating element 3. In the same manner, any other type of cooler with an open liquid cycle can be integrated into the circulation system of the heat exchanger. Thought is thereby given especially to the cooling of any number of stacked cooling boxes as they are being utilized in the cooling of structural disc elements, from which the lost heat must also be removed.

As mentioned above, the instant invention serves to remove heat from cabinets in which are located electronic and/or electrical structural elements. The electrical elements may be of any random type as, for example, valves, relay-guidance systems and the like, which should in general be protected against the influences of the outside atmosphere and against dust. Often combinations of electronic elements, for example a logic with relay guidances and the like are located in a mutual cabinet.

Figure 8:
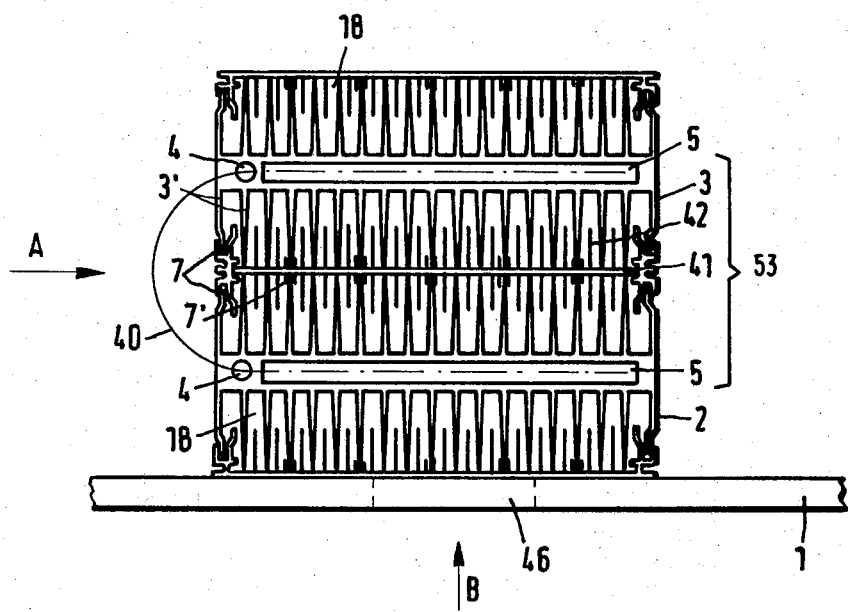
FIG. 8 illustrates a further embodiment in top view.

In the embodiment shown in FIGS. 8 and 9, a heat exchanger unit is mounted onto the wall 1 of a console, from which heat is to be taken. This unit consists in principle of the heat-accepting element 2 and the heat-dissipating element 3. Between both elements, 2, 3, there flows a fluidal interim heat exchanger operating identically to that shown in FIGS. 1 to 3 in a closed cycle, which is indicated only with numeral 40. The up-take pipes are thereby indicated with numeral 4 and the hollow spaces of the elements each are indicated with numeral 5.

The heat dissipation on the basis of the forced circulation of the fluidal interim heat exchanger is overlapped by a further heat-dissipation through an air-to-air-heat exchanger. For this purpose, the two elements 2 and 3 are connected with each other via a heat-conducting separating wall 41. The separating wall 41 may be in the form of a plug-in profile. Thus, it is possible to plug the ribs of the two elements 2 and 3 into matching openings 7, 7' similar to FIG. 2. Consequently, the elements 2 and 3 are screwed together with the separating wall. The above-mentioned plugging-in, as shown by FIG. 8, can be made not only at the two front areas of the elements, but also inside the elements, for example, at each third rib. The separating wall 41 or the respective plug-in profile may furthermore be provided with their own cooling ribs 42.

The warm air is drawn from the inside of the console in accordance with arrow B through an opening 43, and namely, via a plenum 44 which is located above the head-accepting element 2. Reference is hereby made especially to FIG. 9 in which also the movement of the heat is indicated by means of arrows. The air which has thus been cooled in the heat-accepting element proceeds through plenum 45 and a further opening 46 again into the inside of the console.

The separating wall 41 delineates the above explained plenums 44 and 45 which are penetrated by the air, and which may also be closed off by means of a lid 47. The front plate 48 of the heat-dissipating element 3 increases downwardly and encompasses together with a lid 49 enclosing a plenum 50 into which the air enters through opening 51 in accordance with arrow C. It is then transported from here upwards by means of uptake pipe 52 through the element 3 and is blown into the outside at the upper surface of said element. The area of the air-movement which is indicated in FIG. 8 by means of the large bracket 53 forms the air-to-air-heat exchanger within the compact instrument. The upper portion of FIG. 8 is thereby penetrated by the outside air to be heated and the lower portion of the area 53 seen in FIG. 8 is being penetrated in counter-direction by the inside air of the console to be cooled.

As explained, and especially as seen from FIG. 9, the entire unit including the air inlets 43 and 51 and the "Mammut Pump" 14, may form one closed structural unit.

The illustration shown in FIG. 10 represents a further embodiment of the instant invention. Inside a water-tight console 60, shown herein only schematically, and constructed in accordance with German Regulation JP55, is proposed the heat-receiving element 61 which cooperates with the outside-situated, heat-dissipating element 62 in the sense of the above embodiments, i.e., with a forced circulation of a fluidal interim heat-carrier. This circulation is indicated by a broken line with numeral 63.

The heat-accepting element 61 is ventilated by means of a blower 64, while the air-flow 65 at the heat-dissipating element 62 develops through natural convection only. Element 62, as shown by means of a comparison with the size of element 61, is constructed correspondingly larger, in order to be able to dissipate the amount of heat, supplied here by element 61, in spite of the elimination of the ventilator. All of the electrical devices, such as ventilator 64 and the "Mammut Pump", indicated herein at 66 only in the form of a block-illustration, etc., are located inside the console. Thus, the outer element 62 becomes insensitive to any form of water-influence. In the console-wall positioned towards element 62 are required only two plug-in connections for the penetration of air hoses.

The advantageous structure of FIGS. 8 and 9 enable a very compact arrangement of the entire heat exchanger inclusive the ventilators and the "Mammut Pump" into a single unit. This unit in and of itself may be shipped and mounted as a heat exchange system. A further advantage consists in that it is possible to further utilize the elements which are proposed for the construction of the heat exchanger, and especially also those elements which are formed by being cut off from an extrusion profile. The separation wall is air- and dust-tight and separates the air circulation of the heat-accepting element from the heat-dissipating element.

Based on FIG. 10, it is furthermore the scope of the present invention to render a heat exchanger of the present invention suitable for assemblage with a water-tight container. The term "water-tight" may thereby be based on the directions of German Regulation JP 55.

The embodiment of FIG. 10 serves to solve this problem. The given problem is hereby solved in a simple manner under retention of the characteristics and advantages of the invention.

What is claimed is:

1. In a heat exchanger for removing heat from a cabinet comprising: a heat-receiving element for receiving heat from outside of itself adapted to be positioned in a sealed air-exchange relationship with the inside of the cabinet and having an inner hollow space, a inlet means, outlet means, and heat exchange surfaces; heat-dissipating element adapted to be positioned outside the cabinet and having an inner hollow space, inlet means, outlet means, and heat exchange surfaces; means connecting the corresponding inlet means and outlet means of the heat-receiving element and the heat-dissipating element to form a closed cycle in which a liquid circulates; and means for circulating the liquid in the closed cycle between the heat-receiving element and the heat-dissipating element; the improvement wherein the circulating means has no mechanical parts which directly contact the liquid and comprises: an air/liquid siphon consisting of one of the elements; an air moving pump; and an air supply means connecting said air moving pump to said air/liquid siphon; at least said heat-dissipating element further comprises a vertical uptake pipe integrally formed with said hollow space having said inlet means near its bottom and an overflow at its upper area which terminates into the hollow space, said outlet means of the heat-receiving element being connected to said inlet means of the heat-dissipating element, said outlet means of the heat-dissipating element extends from the lower area of the hollow space of the heat-dissipating element for removing the liquid from the same and supplying it to the heat-receiving element, and said heat-dissipating and heat-receiving elements are both constructed as an air-to-air heat exchanger.

2. The heat exchanger according to claim 1, wherein the heat exchange surfaces of the heat-receiving element are adjacent to the heat exchange surfaces of heat-dissipating elements in a heat-conducting manner, and are in thermal connection with each other by a heat-conducting structural section.

3. The heat-exchanger according to claims 1 and 2 wherein said heat exchange surfaces comprise cooling ribs and the two elements are arranged adjacent to each other in a manner so that the two elements with the respective outer edges of their cooling ribs abut heat-conductively and heat-transmittingly a wall which wall serves as a heat-conductive structural portion in the upwards direction of the interim heat carrier.

4. The heat exchanger according to claim 3, wherein said separating wall serves simultaneously for mechanically connecting the two elements and is constructed as a plug-in profile with plug-in openings for receiving the cooling ribs.

5. The heat exchanger according to claim 3, wherein said cooling ribs which abut the separating wall are in alignment with each other.

6. In a heat exchanger for removing heat from a cabinet comprising: a heat receiving element for receiving heat from outside of itself adapted to be positioned inside of the cabinet and having an inner hollow space, inlet means, outlet means, and heat exchange surfaces, heat-dissipating element adapted to be positioned outside of the cabinet and having an inner hollow space, inlet means, outlet means and heat exchange surfaces; means connecting the corresponding inlet means and outlet means of the heat-receiving element and the heat-dissipating element to form a closed cycle in which a liquid circulates; and means for circulating the liquid in the closed cycle between the heat-receiving element and the heat-dissipating element; the improvement wherein the cabinet is watertight and the circulating means has no mechanical parts which directly contact the liquid and comprises: an air/liquid siphon consisting of one of the elements; an air moving pump; and an air supply means connecting said air moving pump and said air/liquid siphon; at least said heat-dissipating element further comprises a vertical uptake pipe integrally formed with said hollow space having said inlet means near its bottom and an overflow at its upper area which terminates into the hollow space, said outlet means of the heat-receiving element being connected to said inlet means of the heat-dissipating element and said outlet means of the heat-dissipating element extends from the lower area of the hollow space of the heat-dissipating element for removing the liquid from the same and supplying it to the heat-receiving element; said air moving pump being located inside of said watertight cabinet, a ventilating blower located inside of said cabinet to circulate air over said heat-receiving element, and the heat exchange surfaces of said heat-dissipating element being provided with cooling ribs so that heat removal is solely by natural convection.

7. The heat exchanger according to claim 6, wherein said means for connecting said inlet and outlet means and said air supply means pass through watertight openings in said cabinet.

* * * * *